United States Patent

Bezama et al.

[11] Patent Number: 5,907,985
[45] Date of Patent: Jun. 1, 1999

[54] PUNCH APPARATUS WITH IMPROVED SLUG REMOVAL EFFICIENCY

[75] Inventors: Raschid Jose Bezama, Mahopac; Laertis Economikos, Wappingers Falls; Keith Colin O'Neil, Hughsonville, all of N.Y.

[73] Assignee: International Business Machines Corporation, Armonk, N.Y.

[21] Appl. No.: 08/898,442

[22] Filed: Jul. 22, 1997

[51] Int. Cl.⁶ ...................................... B26D 7/18
[52] U.S. Cl. ................................. 83/24; 83/98; 83/100; 83/685
[58] Field of Search .................. 83/23, 24, 26, 83/55, 98, 99, 102, 111, 137, 168, 169, 685, 100; 234/1, 97

[56] References Cited

U.S. PATENT DOCUMENTS

| 4,425,829 | 1/1984 | Kranik et al. |
|---|---|---|
| 4,628,780 | 12/1986 | Hicks . |
| 4,821,614 | 4/1989 | Fleet et al. |
| 4,856,393 | 8/1989 | Braddon ........................... 83/55 |
| 4,856,399 | 8/1989 | Deshet ............................. 83/55 |
| 4,989,482 | 2/1991 | Mason .............................. 83/98 |
| 5,111,723 | 5/1992 | Andrusch et al. . |
| 5,214,991 | 6/1993 | Shimizu et al. . |

FOREIGN PATENT DOCUMENTS

| 5-57687 | 3/1993 | Japan . |
|---|---|---|
| 5-261454 | 10/1993 | Japan . |
| 17446 | of 1908 | United Kingdom . |

*Primary Examiner*—Rinaldi I. Rada
*Assistant Examiner*—Gyounghyun Bae
*Attorney, Agent, or Firm*—Ratner & Prestia; Ira D. Blecker

[57] ABSTRACT

A punch tool for punching a slug from a workpiece. The punch of the punch tool has a reciprocating travel path with a transition region where the punch changes direction. A die plate of the punch tool has an aperture. A support bushing disposed in the aperture of the die plate provides support for the workpiece and has an underside and an opening through which the punch and the slug pass. A nozzle disposed in the aperture of the die plate provides an internal passage for the removal of punch slugs from the tool. The nozzle has a top and a side wall with a hole disposed in the side wall adjacent the transition region of the reciprocating travel path of the punch. The nozzle, the support bushing, and the die plate are integrated to form a flow path delivering a gas flow to the hole in the nozzle. The flow path and the hole direct the gas flow on a slug attached to the punch in the transition region of the reciprocating travel path of the punch to remove the slug from the punch.

18 Claims, 2 Drawing Sheets

PUNCH APPARATUS WITH IMPROVED SLUG REMOVAL EFFICIENCY

TECHNICAL FIELD

The present invention relates generally to a punch which forms holes in thin sheet material and, more particularly, to an improved nozzle with a positive slug removal feature to facilitate punching in materials such as green ceramic sheets.

BACKGROUND OF THE INVENTION

A plurality of ceramic green sheets are used in the manufacture of multilayer ceramic substrates for integrated circuit semiconductor package structures. Via holes are punched in the ceramic green sheets to form a path for electrical interconnections through the sheets. The step of punching the via holes in ceramic green sheets presents formidable engineering problems in view of the small size and density of the holes and of the complex hole patterns needed. The sheets themselves are typically thin: only about 0.2 mm (8 mils) thick.

It is convenient to punch via holes with a tool of the type disclosed in U.S. Pat. No. 4,425,829 issued to Kranik et al. In this type of tool, a plurality of punch elements are arranged in a grid on a punch head and are indexed over the green sheet which is covered by an interposer mask. The interposer mask contains openings where holes will be punched. When the punch elements contact the interposer mask, as the punch head is moved downwardly, a hole will be punched where the openings occur because the punch element will pass through the openings in the interposer mask and then through the ceramic green sheet. In other areas covered by the interposer mask (i.e., where holes are not desired), the interposer mask will cause the punch element to be retracted into the head. The green sheet is sequentially indexed through a predetermined number of positions to complete the punching of a sheet.

It is essential that the punching operation produce products free from defects. A single defect can potentially render a green sheet unsuitable for further processing. It is also essential that the punching operation be rapidly and accurately performed. Each green sheet can contain over 100,000 punched holes. Of particular concern is the adherence to the tip of the punch of a slug punched from the sheet. The inherent adhesion characteristics of the unfired green sheet are amplified by the large punching force applied over the small area of the punch tip. The diameter of the punch tip can be as small as 0.13 to 0.15 mm (5 to 6 mils) in current application and is expected to be 0.10 mm (4 mils) or less for advanced substrates, resulting in a pressure at the punch tip on the order of 2,700 kg/cm$^2$. If the punch slug adheres to the punch, the slug may be drawn back into the punched hole, causing a substrate defect. To eliminate the likelihood of such defects, it has been standard practice to use two punch strokes for each hole. This practice greatly increases green sheet processing time.

The problem of slug adhesion to the punch is not limited to the punching of ceramic green sheets; rather, the problem has been discussed in other punching application references. One method used in punching apparatus for the removal of punch slugs is the use of either pressurized air or a vacuum to force the slug from the punch. Certain references disclose apparatus in which air is channeled through the punch to remove the slug from the tip of the punch. This method is not practical, however, for punching extremely small diameter holes. Other applications either direct air into or apply a vacuum to a chamber below the punch to clear the slugs and do not directly address the problem of slug adherence.

The use of air flow slug removal methods in ceramic green sheet punching to achieve single stroke punching is disclosed in U.S. Pat. No. 5,111,723 issued to Andrusch et al. and U.S. Pat. No. 4,425,829 issued to Kranik et al. Kranik et al. teach a tube protruding into the die bushing which upwardly injects air into the die cavity below the punching area. This air flow induces circulation in the die bushing cavity which assists in forcibly removing slugs from the punch. The arrangement does not provide the repeatability necessary to achieve single stroke punching.

Andrusch et al. teach a single stroke punch apparatus which includes a punch and a bushing retention die plate. A support bushing is mounted in the die plate and provides support for the workpiece. The support bushing has a clearance for a punch. The apparatus also has a nozzle (or "slug removal bushing") mounted in the die plate which provides an internal passage for the removal of punch slugs from the apparatus. A slug is punched from the workpiece through an opening in an end wall of the support bushing disposed in an aperture of the die plate. The nozzle, the support bushing, and the bushing retention die plate define a flow passage allowing gas to flow in the die plate to the opening in the support bushing. The gas flow impinges on the slug attached to the punch tip proximate to the end wall of the support bushing and at the top of the nozzle to remove the slug from the punch through a slug removal passage in the nozzle.

The flow passage includes a channel (or "slot clearance") between the end wall at the top of the nozzle and the support bushing. Unfortunately, the slot clearance prevents a sealed surface between the support bushing and the nozzle, thus allowing the rapid expansion of gas (air) as it enters the region immediately below this interface. Without a sealed interface, the gas tends to expand too quickly into the volume surrounding the punch tip and slug and is sometimes ineffective for blowing the slug from the punch tip.

In addition, the gas flow impinges on the slug attached to the punch tip just after the punch tip clears the end wall of the nozzle—where the punch tip minimally protrudes through the support bushing. The punch is moving downward rather quickly at this point in its reciprocating travel path and, therefore, the impingement of the gas flow on the slug is almost instantaneous. The duration of impingement is sometimes insufficient to blow the slug from the punch tip.

Finally, the position of a slot clearance between the top of the nozzle and the support bushing facilitates wear of the nozzle. Such wear reduces the efficiency of the punch over time. This position of the slot clearance also renders the diameter of the gas flow inlet dependent on how well the support bushing fits on the top of the nozzle. Consequently, the effective inlet diameter is variable.

Although both the Kranik et al. and Andrusch et al. configurations have been useful in removing slugs from the punch tip, neither configuration provides the 100% slug removal which is required for single stroke punching. A 99.9% slug removal rate on a green sheet containing 100,000 holes results in 100 defects per sheet, any one of which renders the sheet unacceptable for further processing. The problem can be further appreciated by considering that a defect may not be detected until the green sheet is laminated into a substrate containing 60 or more layers. Thus, the conventional tools used to remove a punch slug are not effective to the degree needed when punching 0.2 mm (8 mils) thick green sheets in high volume manufacturing. The slug that is punched out is not always removed, resulting in via blockage.

The deficiencies of the conventional punch apparatus show that a need still exists for a tool which will precisely direct an air flow at a punch tip to remove the punch slug and thus allow single stroke punching. To overcome the shortcomings of the conventional punch apparatus, a new punch tool is provided. An object of the present invention is to provide a single stroke punch tool which offers improved punch slug removal.

A related object is to improve the design of the converging-diverging nozzle that fits within the die bushing of the punch tool to achieve air flow velocities sufficient to remove the slug from the punch tip. It is a further object of the invention to provide a punch slug removal tool which precisely directs an air flow at the slug adhered to a punch tip. Another object is to assure that the maximum force of the air flow is applied to the adhered slug for the maximum length of time, thus making the air flow more effective.

It is still another object of the present invention to seal the surface between the support bushing and the nozzle, preventing the rapid expansion of the gas which reduces the effectiveness of the gas for blowing off the slug. An additional object is to fix the effective inlet diameter of the path for the gas flow. Yet another object of this invention is to eliminate wear of the nozzle, thereby improving the efficiency of the punch over time.

SUMMARY OF THE INVENTION

To achieve these and other objects, and in view of its purposes, the present invention provides a punch tool for punching a slug from a workpiece. The punch of the punch tool has a reciprocating travel path with a transition region where the punch changes direction. A die plate of the punch tool has an aperture. A support bushing disposed in the aperture of the die plate provides support for the workpiece and has an underside and an opening through which the punch and the slug pass. A nozzle disposed in the aperture of the die plate provides an internal passage for the removal of punch slugs from the tool. The nozzle has a top and a side wall with a hole disposed in the side wall adjacent to the transition region of the reciprocating travel path of the punch. The nozzle, the support bushing, and the die plate are integrated to form a flow path delivering a gas flow to the hole in the nozzle. The flow path and the hole direct the gas flow on a slug attached to the punch in the transition region of the reciprocating travel path of the punch to remove the slug from the punch.

The invention also provides a method for punching which includes providing a workpiece proximate a surface of a die plate defining an aperture. The method further includes punching a slug from the workpiece through an opening in an end wall of a support bushing disposed in the aperture. A gas flow is directed through a flow passage defined by the support bushing, the interior wall of the die plate defining the aperture, and a nozzle disposed in the aperture. The gas flow impinges on the slug attached to the punch in the transition region of the reciprocating travel of the punch to remove the slug from the punch through a slug removal passage of the nozzle.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 2:
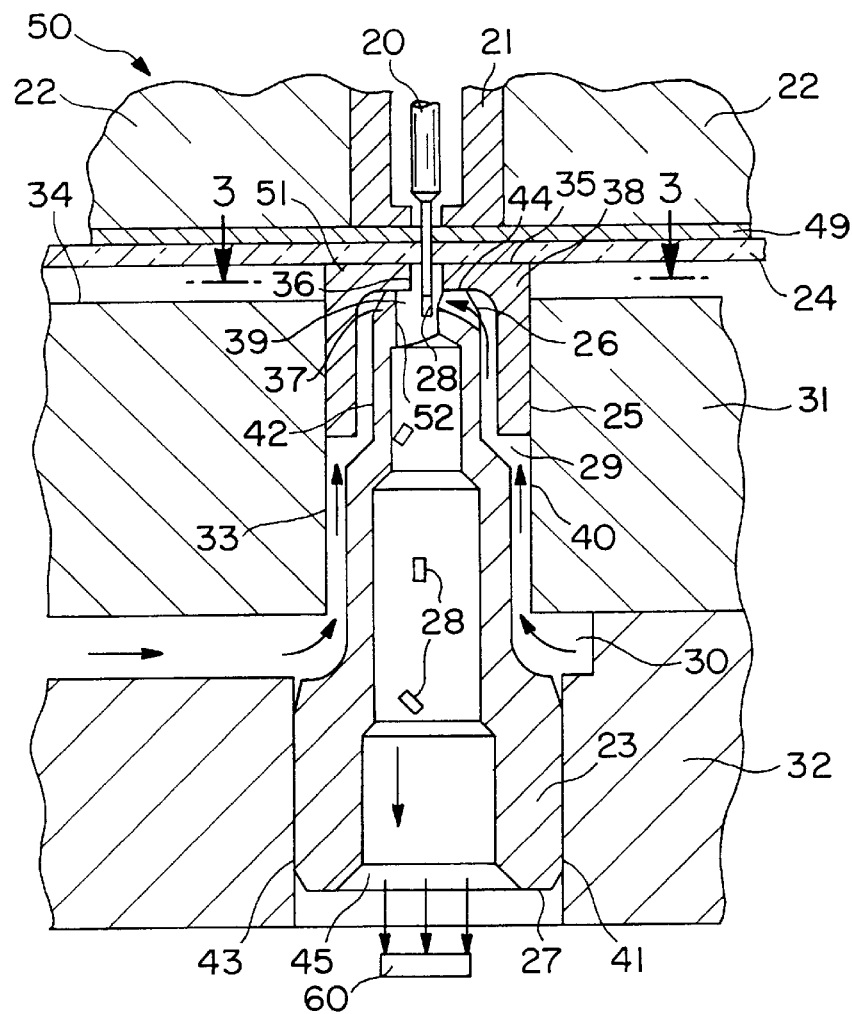
FIG. 2 is a cross-section of a conventional slug removal and punch apparatus.
Figure 3:
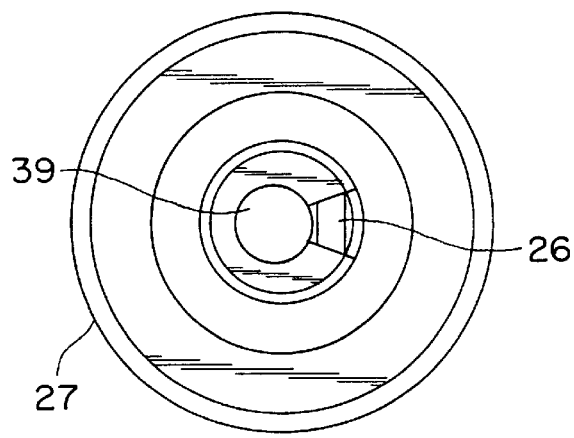
FIG. 3 is a top view of the conventional nozzle of the apparatus illustrated in FIG. 2.

Referring now to the drawing, wherein like reference numerals refer to like elements throughout, FIG. 2 shows a cross-section of a conventional slug removal and punch apparatus. FIG. 3 is a top view of the conventional nozzle of the apparatus illustrated in FIG. 2. These figures show the punch apparatus 50 of U.S. Pat. No. 5,111,723 issued to Andrusch et al.

As illustrated, apparatus 50 includes a punch 20. Although punch 20 may be an individual punch, it is preferably one of multiple punches in a punch head as shown in U.S. Pat. No. 4,425,829 issued to Kranik et al. Punch 20 is located in punch housing 22 by punch bushing 21. Punch 20 punches a workpiece 24, which in a preferred embodiment is a ceramic green sheet, removing punch slug 28. Slug 28 often adheres to the end or tip of punch 20. The invention works with workpiece materials other than green sheets. As shown in FIG. 2, an interposer 49 defining a punch pattern may be placed between punch housing 22 and workpiece 24 if spacing allows.

A die plate includes a bushing plate 31 and a manifold plate 32. The die plate defines an aperture (or bushing receiving feature) 40 which retains the components discussed below. In the illustrated embodiment, aperture 40 has a first diameter 33 and second diameter 41. The two diameters are formed respectively in bushing plate 31 and manifold plate 32. These diameters may be concentric and, in the preferred multiple punch embodiment, form a series of apertures which open on the surface 34 of the die plate which faces workpiece 24. Manifold plate 32 of the die plate also includes a port 30 for introducing gas flow into aperture 40. The gas may be any type of gas suitable for removing punch slug 28 from punch 20. In the illustrated embodiment compressed air is preferably used for slug removal.

Apparatus 50 has a support bushing 38 which supports workpiece 24. Support bushing 38 is mounted in aperture 40. In the preferred embodiment, support bushing 38 is fabricated from carbide steel and is pressed into bushing plate 31. The end wall 51 of support bushing 38 has a workpiece supporting surface 35 which includes an opening 36 providing clearance for punch 20 and attached slug 28. Workpiece support surface 35 of support bushing 38 is preferably offset with respect to workpiece facing surface 34 of bushing plate 31 so that it is elevated with respect to surface 34. Workpiece 24 rests on support bushing 38 rather than on bushing plate 31, which prevents marring damage to workpiece 24. In the multiple punch configuration, of course, a whole series of support bushings 38 define the support surface 35 on which workpiece 24 rests.

A nozzle (or slug removal bushing) 27 is disposed in aperture 40 (i.e., within bushing plate 31 and manifold plate 32 which form the die plate). Nozzle 27 is a converging-diverging type of nozzle and is important to achieve air flow velocities sufficient to remove slug 28 from the tip of punch 20. A first end 37 of nozzle 27 is proximate to end wall 51 of support bushing 38 on the side of end wall 51 opposite workpiece support surface 35. First end 37 provides end clearance 39 for passage of punch 20 and attached workpiece slug 28. Nozzle 27 also has a channel 26 formed at the top of the right side wall 23 of nozzle 27. FIG. 3 is a top view of nozzle 27 and illustrates end clearance 39 and channel 26.

Nozzle 27, support bushing 38, and aperture 40 together are integrated to define a flow passage 29 for carrying the gas flow from port 30 to channel 26, as is indicated by the arrows in FIG. 2. Because channel 26 is taken from first end 37 of nozzle 27 proximate end wall 51, the gas is delivered directly adjacent end wall 51.

The exit of channel 26 must be as close to punch 20 and slug 28 as possible. It is also desirable that left side wall 52 of nozzle 27 opposing channel 26 be as far away from slug 28 as practical. This configuration helps prevent contaminant particles from being expelled through opening 36, which could lead to contamination of punch bushing 21. To achieve these objectives, an offset is provided between opening 36 and end clearance 39, as shown in FIG. 2. The shape of channel 26 also helps to direct the gas flow downward and away from workpiece 24. The illustrated configuration provides a velocity at the exit of channel 26 of approximately 230 m/sec, thus facilitating positive removal of slug 28 from the tip of punch 20.

Nozzle 27 may be fabricated from a deformable polymeric material such as polyoxymethylene. Support bushing 38 is pressed into bushing plate 31, which is one section of the die plate. The second section of the die plate is manifold plate 32, which at least partially contains nozzle 27 and into which nozzle 27 is pressed. The attachment of these plates forms a concentric bushing arrangement and forms a seal 44 when the deformable material of nozzle 27 is pushed into support bushing 38 to abut end wall 51. Seal 44 enhances the gas flow to concentrate it in such a manner as to positively remove punch slug 28 from punch 20. The plate can be separated for rework of workpiece support surface 35 of support bushing 38 as it wears due to impact from punch 20. Support bushing 38 can also be removed and replaced when its rework limit is reached without necessitating the replacement of nozzle 27.

First die plate diameter 33 and second die plate diameter 41 are concentric and form aperture 40. When bushing plate 31 and manifold plate 32 are attached, support bushing 38 and nozzle 27 form a concentric bushing arrangement. Support bushing 38 is disposed in first die plate diameter 33 at bushing diameter 25 and nozzle 27 is stepped, having first diameter 43 which is disposed in second die plate diameter 41 and having second diameter 42 which is disposed within support bushing 38 to form an annular region between support bushing 38 and nozzle 27. Nozzle 27 defines slug removal passage 45 opposite workpiece 24 for removal of punch slug 28. Disposal of the punch slugs which have been removed by the gas flow is enhanced by subjecting slug removal passage 45 to an applied vacuum 60 as is well known to those skilled in the art.

Channel 26 of conventional nozzle 27 illustrated in FIGS. 2 and 3 has a diameter of about 0.2 mm (8 mils) and allows the air flow to impinge on slug 28 as the tip of punch 20 travels downward inside nozzle 27. Channel 26 is located at the top of nozzle 27 (i.e., at first end 37). A mathematical modeling computer program was used to calculate the maximum force applied to slug 28 by the air flow and the duration for which that force is applied (i.e., the application time).

Figure 1:
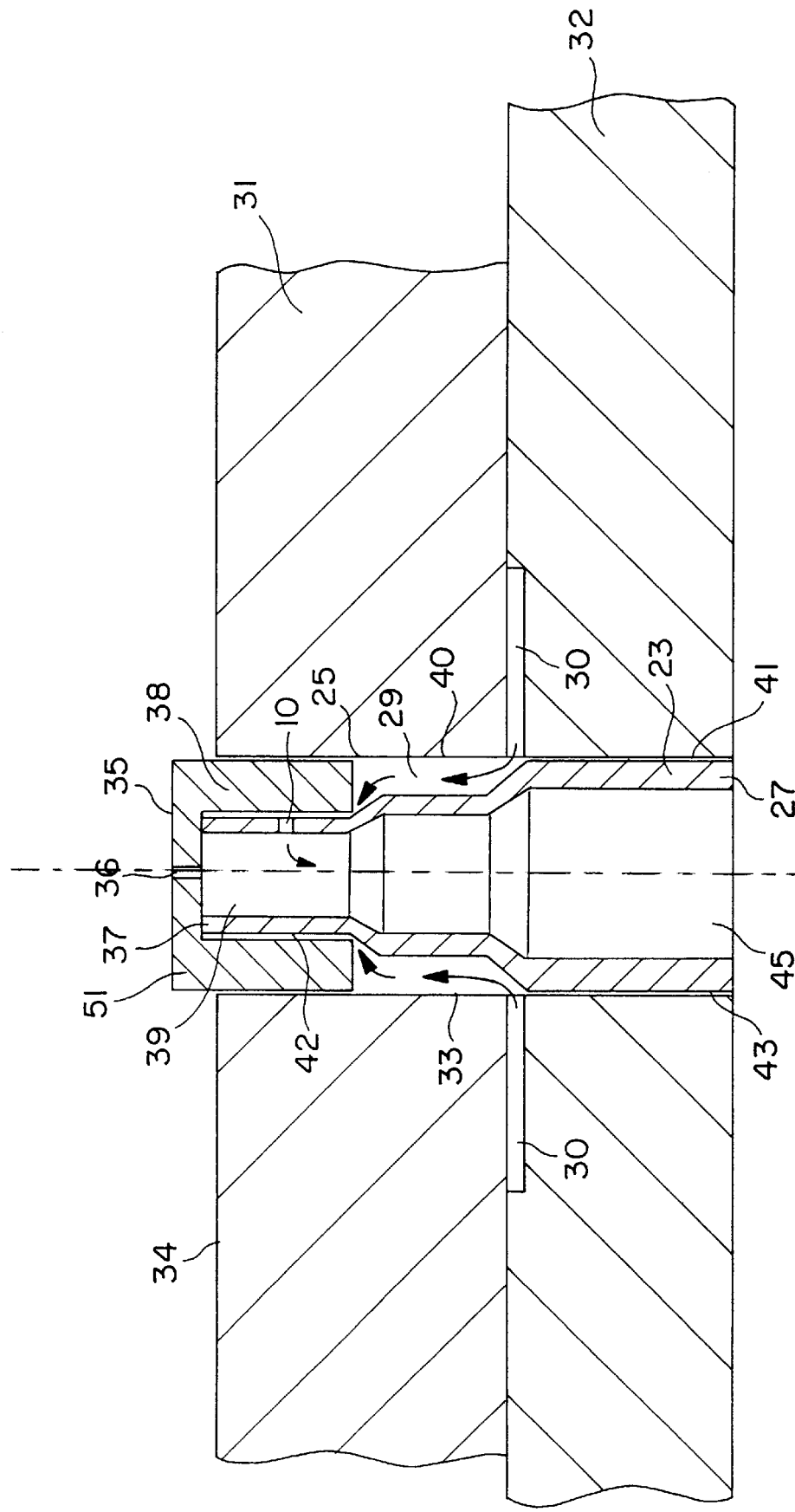
FIG. 1 is a cross-section of the slug removal elements and punch tool of the present invention.

Turning to FIG. 1, a cross-section of the slug removal elements and punch tool of the present invention is shown. A comparison of FIGS. 1 and 2 illustrates the improvement achieved by the present invention. Specifically, channel 26 of conventional nozzle 27, illustrated in FIGS. 2 and 3, has been replaced by a hole 10 positioned in right side wall 23 of nozzle 27 adjacent to the transition region of the reciprocating travel path of the punch. Hole 10 preferably has a diameter of about 0.2 mm (8 mils).

Hole 10 is displaced downward from first end 37 of nozzle 27 relative to channel 26 in conventional nozzle 27. Specifically, hole 10 is positioned between about 0.20–0.40 mm (8–16 mils) below and, preferably, 0.25 mm (10 mils) below first end 37 of nozzle 27. Note that first end 37 abuts the underside of support bushing 38 in the design of the present invention; therefore, hole 10 is also displaced by the same distance below the underside of support bushing 38.

The improved placement of hole 10 relative to conventional channel 26 allows a jet of gas (air) to impinge upon slug 28 that is attached to the tip of punch 20 while punch 20 is in the transition region of its reciprocating travel. Air flow hits the tip of punch 20 at the very bottom of its stroke (bottom dead center)—at precisely the best point in the travel of punch 20—assuring that air impinges on the tip of punch 20 and slug 28, if slug 28 has adhered to the tip, for the maximum time. Thus, air is introduced through right side wall 23 of nozzle 27 and not at the top of nozzle 27 through conventional channel 26. Hole 10 is provided at a more efficient location where the air blast impinges directly on slug 28 at the point of maximum stroke of punch 20.

The improved design of nozzle 27 according to the present invention yields the same maximum force, calculated again by a mathematical modeling computer program, on the tip of punch 20 and slug 28 as for the conventional design. The maximum force is about 0.11 grams. The design of the present invention applies the maximum force for about twenty percent longer time, however, thus making it more effective. Furthermore, the effective inlet diameter of flow passage 29 in the design of the present invention is fixed. The inlet diameter of the conventional design depends on how well support bushing 38 fits on first end 37 (i.e., on the top) of nozzle 27.

Removal of channel 26 allows the surface between support bushing 38 and nozzle 27 to be sealed, thus preventing the rapid expansion of gas (air) as the gas enters the region immediately below this interface. In other words, the top or first end 37 of nozzle 27 is intimate with or abuts the underside of support bushing 38. Without the sealed interface between nozzle 27 and support bushing 38 shown in FIG. 1, the gas expands too quickly and may be ineffective for blowing slug 28 off the tip of punch 28.

Not only is precisely positioned hole 10 more efficient than prior channel 26, the design of the present invention also eliminates wear of nozzle 27. Reduced wear improves the efficiency of punch 20 over time. In addition, there is no need to form an offset between opening 36 and end clearance 39, as shown in FIG. 2 for the conventional design, in the design of the present invention. Instead, opening 36 and end clearance 39 may be concentric as shown in FIG. 1. In addition, first die plate diameter 33 and second die plate diameter 41 are approximately equal, forming aperture 40 with a uniform diameter.

Implementation of the present invention allows single stroke punching. The invention essentially provides positive 100% punch slug removal, with minimal defective sheets, when used for punching ceramic green sheets and provides significant process time improvement over the previously practiced punching methods.

The method for removing workpiece slugs from a punch allowed by the punch tool of the present invention includes the steps of providing workpiece 24 proximate surface 34 of the die plate defining aperture 40; punching slug 28 from workpiece 24 through opening 36 in end wall 37 of support bushing 38 disposed in aperture 40; directing a gas flow through flow passage 29 defined by support bushing 38, the interior wall of the die plate defining aperture 40, and nozzle 27 disposed in aperture 40; and impinging the gas flow on slug 28 attached to punch 20 in the transition region of the reciprocating travel of punch 20 to remove slug 28 from punch 20 through slug removal passage 45 of nozzle 27. The method may also include inserting interposer 49 defining a desired punch pattern between punch 20 and workpiece 24. Assistance in punch slug removal may be provided by applying a vacuum to slug removal passage 45 of nozzle 27.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for punching which comprises the steps of:
   providing a workpiece proximate a surface of a die plate defining an aperture;
   punching a slug from the workpiece through an opening in an end wall of a support bushing disposed in the aperture;
   directing a gas flow first through a flow passage defined by the support bushing, the interior wall of the die plate defining the aperture, and the side wall of a nozzle disposed in the aperture and then through a hole disposed in the side wall of the nozzle and spaced from and below the top of the nozzle and at the transition region of the reciprocating travel of the punch; and
   impinging the gas flow on the slug attached to the punch in the transition region of the reciprocating travel of the punch to remove the slug from the punch through a slug removal passage of the nozzle.

2. The method of claim 1 further comprising the step of inserting an interposer defining a desired punch pattern between the punch and the workpiece.

3. The method of claim 1 further comprising the step of providing a vacuum to the slug removal passage to assist slug removal from the nozzle.

4. A punch tool for punching a slug from a workpiece, the punch tool comprising:
   a punch having a reciprocating travel path with a transition region where the punch changes direction;
   a die plate having an aperture;
   a support bushing disposed in the aperture of the die plate, the support bushing providing support for the workpiece and having an underside and an opening through which the punch and a slug pass;
   a nozzle disposed in the aperture of the die plate, the nozzle having a top and a side wall with a hole disposed in the side wall and spaced from and below the top of the nozzle and providing an internal passage for the removal of punch slugs from the tool; and
   means for directing a gas flow through the hole and on a slug attached to the punch in the transition region of the reciprocating travel path of the punch to remove the slug from the punch.

5. The tool of claim 4 wherein the top of the nozzle and the underside of the support bushing abut to form a seal.

6. The tool of claim 4 further comprising a vacuum applied to the slug removal passage, the vacuum enhancing removal of punch slugs from the tool.

7. The tool of claim 4 wherein the nozzle, the support bushing, and the die plate are integrated to form part of the gas flow directing means.

8. The tool of claim 7 wherein the side wall of the nozzle has a hole forming part of the gas flow directing means.

9. The tool of claim 8 wherein the hole is positioned adjacent the transition region of the reciprocating travel path of the punch.

10. The tool of claim 9 wherein the hole is positioned between 0.20–0.40 mm below the top of the nozzle.

11. The tool of claim 10 wherein the hole is positioned about 0.25 mm below the top of the nozzle.

12. The tool of claim 8 wherein the hole has a diameter of about 0.2 mm.

13. A punch tool for punching a slug from a workpiece, the punch tool comprising:
   a punch having a reciprocating travel path with a transition region where the punch changes direction;
   a die plate having an aperture;
   a support bushing disposed in the aperture of the die plate, the support bushing providing support for the workpiece and having an underside and an opening through which the punch and the slug pass; and
   a nozzle disposed in the aperture of the die plate, the nozzle providing an internal passage for the removal of punch slugs from the tool and having a top and a side wall with a hole disposed in the side wall and spaced from and below the top and adjacent the transition region of the reciprocating travel path of the punch;
   wherein the nozzle, the support bushing, and the die plate are integrated to form a flow path delivering a gas flow to the hole in the nozzle, the flow path and the hole directing the gas flow on a slug attached to the punch in the transition region of the reciprocating travel path of the punch to remove the slug from the punch.

14. The tool of claim 13 wherein the top of the nozzle and the underside of the support bushing abut to form a seal.

15. The tool of claim 13 further comprising a vacuum applied to the slug removal passage, the vacuum enhancing removal of punch slugs from the tool.

16. The tool of claim 13 wherein the hole is positioned between 0.20–0.40 mm below the top of the nozzle.

17. The tool of claim 16 wherein the hole is positioned about 0.25 mm below the top of the nozzle.

18. The tool of claim 13 wherein the hole has a diameter of about 0.2 mm.

* * * * *